United States Patent
Ihs

(10) Patent No.: US 9,985,620 B2
(45) Date of Patent: May 29, 2018

(54) FAST PRE-AMP LATCH COMPARATOR

(71) Applicant: Endura Technologies LLC, San Diego, CA (US)

(72) Inventor: Hassan Ihs, San Diego, CA (US)

(73) Assignee: Endura Technologies LLC, San Diego, CA (US)

( * ) Notice: Subject to any disclaimer, the term of this patent is extended or adjusted under 35 U.S.C. 154(b) by 0 days. days.

(21) Appl. No.: 15/174,886

(22) Filed: Jun. 6, 2016

(65) Prior Publication Data

US 2016/0359477 A1    Dec. 8, 2016

Related U.S. Application Data

(60) Provisional application No. 62/171,901, filed on Jun. 5, 2015.

(51) Int. Cl.
*H03K 3/356* (2006.01)
*H03K 5/24* (2006.01)

(52) U.S. Cl.
CPC ............. *H03K 5/24* (2013.01); *H03K 5/2481* (2013.01)

(58) Field of Classification Search
None
See application file for complete search history.

(56) References Cited

U.S. PATENT DOCUMENTS

| | | | |
|---|---|---|---|
| 6,144,231 A | 11/2000 | Goldblatt | |
| 6,292,030 B1 | 9/2001 | Shih | |
| 6,329,942 B1 | 12/2001 | Nagaraj et al. | |
| 6,617,899 B2 * | 9/2003 | Cyrusian | H03K 5/2481 327/199 |
| 7,619,456 B2 * | 11/2009 | Kim | H03K 5/15013 327/161 |
| 8,198,920 B2 * | 6/2012 | Chatal | G11C 27/024 327/205 |
| 2007/0008026 A1 | 1/2007 | Lin et al. | |
| 2009/0021283 A1 | 1/2009 | Payne et al. | |
| 2009/0121911 A1 | 5/2009 | Kuramochi | |
| 2011/0115538 A1 | 5/2011 | Jansson | |
| 2013/0010855 A1 * | 1/2013 | Zerbe | G11C 7/1057 375/232 |
| 2013/0057422 A1 | 3/2013 | Johansson et al. | |
| 2015/0061730 A1 | 3/2015 | Tsai et al. | |

OTHER PUBLICATIONS

Andrea Bonfanti et al. "A Multi-Channel Low-Power System-on-Chip for in Vivo Recording and Wireless Transmission of Neural Spikes", Journal of Low Power Electronics and Applications, Sep. 2012, vol. 2, Issue 4, pp. 211-241, ISSN 2079-9268.
International Search Report on related PCT Application No. PCT/US2016/036107 from International Searching Authority (KIPO) dated Sep. 30, 2016.
Written Opinion on related PCT Application No. PCT/US2016/036107 from International Searching Authority (KIPO) dated Sep. 30, 2016.

* cited by examiner

*Primary Examiner* — Long Nguyen
(74) *Attorney, Agent, or Firm* — Klein, O'Neill & Singh, LLP

(57) ABSTRACT

A fast latched comparator may include an amplifier portion and a latch portion. A switch activated by a reset pulse may short together outputs of the latched comparator.

7 Claims, 5 Drawing Sheets

FAST PRE-AMP LATCH COMPARATOR

CROSS REFERENCE TO RELATED APPLICATION

This application claims the benefit of the filing date of U.S. Provisional Patent Application No. 62/171,901, filed on Jun. 5, 2015, the disclosure of which is incorporated by reference herein.

BACKGROUND OF THE INVENTION

The present invention relates generally to electronic circuits, and more particularly relates to a latched comparator. Latched comparators may be often of use in integrated circuit devices. Unfortunately, latched comparators may have difficulties in quickly performing comparisons, and quickly providing reliable outputs.

BRIEF SUMMARY OF THE INVENTION

Embodiments provide a fast latched comparator in accordance with aspects of the invention. Some embodiments utilize a reset pulse to short together outputs of the latched comparator. The reset pulse may allow faster settling of outputs of the latched comparator.

Some embodiments in accordance with aspects of the invention provide a high-speed comparator, comprising: a differential amplifier configured to receive differential input signals and generate a differential pair of intermediate signals; a latch configured to generate a pair of output signals at a respective pair of latching nodes based on the differential pair of intermediate signals; and a reset switch configured to control the pair of output signals based on a reset pulse so as to settle the pair of output signals, the reset switch configured to couple the pair of latching nodes.

Some embodiments in accordance with aspects of the invention provide a method for operating a high-speed comparator having a differential amplifier and a latch comprising: receiving a differential pair of input signals by the differential amplifier; generating a differential pair of intermediate signals by the differential amplifier using the differential pair of input signals; receiving, by the latch, the differential pair of intermediate signals; providing, by the latch, a pair of output signals at a respective pair of latching nodes based on the differential pair of intermediate signals; and activating a reset switch based on a reset pulse having a duty cycle, the reset switch coupling the pair of latching nodes.

These and other aspects of the invention are more fully comprehended upon review of this disclosure.

DETAILED DESCRIPTION

Figure 1:
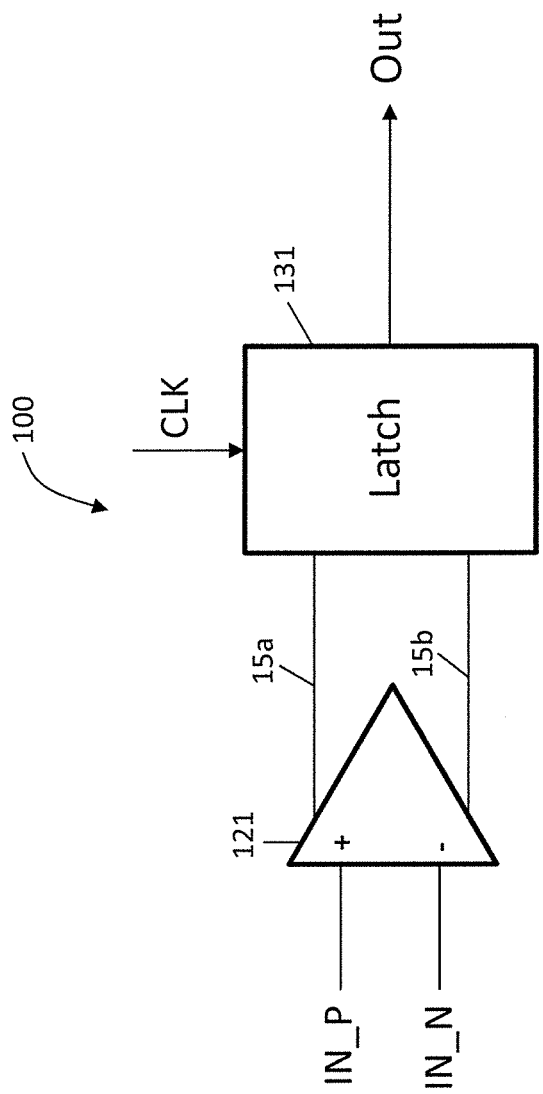
FIG. 1 illustrates a block diagram of a latching comparator in accordance with aspects of the invention.

FIG. 1 illustrates a block diagram of a latching comparator in accordance with aspects of the invention. The latching comparator 100 includes a differential amplifier 121 and a latch 131. A non-inverting input signal and an inverting input signal may be provided to the differential amplifier at input IN_P and input IN_N respectively. The differential amplifier generates a pair of intermediate differential signals 15a,b using the inverting and non-inverting input signals. The pair of intermediate differential signals may be provided to the latch 131. The latch generates an output signal at output (Out) based on the intermediate differential signals.

Generally, the differential amplifier 121 amplifies the non-inverting and inverting input signals of inputs IN_P and IN_N, respectively, whose common-mode component may vary over a wide range of voltages. More specifically, the differential amplifier receives the inverting and non-inverting input signals at gates of transistors and a difference between the input signals is operated on for outputting the pair of intermediate differential signals using a pre-amplification operation.

Latch 131 receives the pair of intermediate differential signals from the differential amplifier, and holds or latches the intermediate differential signals when the latch transitions from a track phase to a hold phase. In essence, the latch transitions from the track phase to the hold phase when a latch signal (CLK) transitions from logic low ("0") to logic high ("1"). The latch then produces an output signal based on the latched intermediate differential signals. In some embodiments, the latch may generate a pair of output signals at a respective pair of latching nodes based on the latched intermediate differential signals. As a result of this arrangement, there is a lower loss in rail to rail swing between the latch and the differential amplifier.

Figure 2:
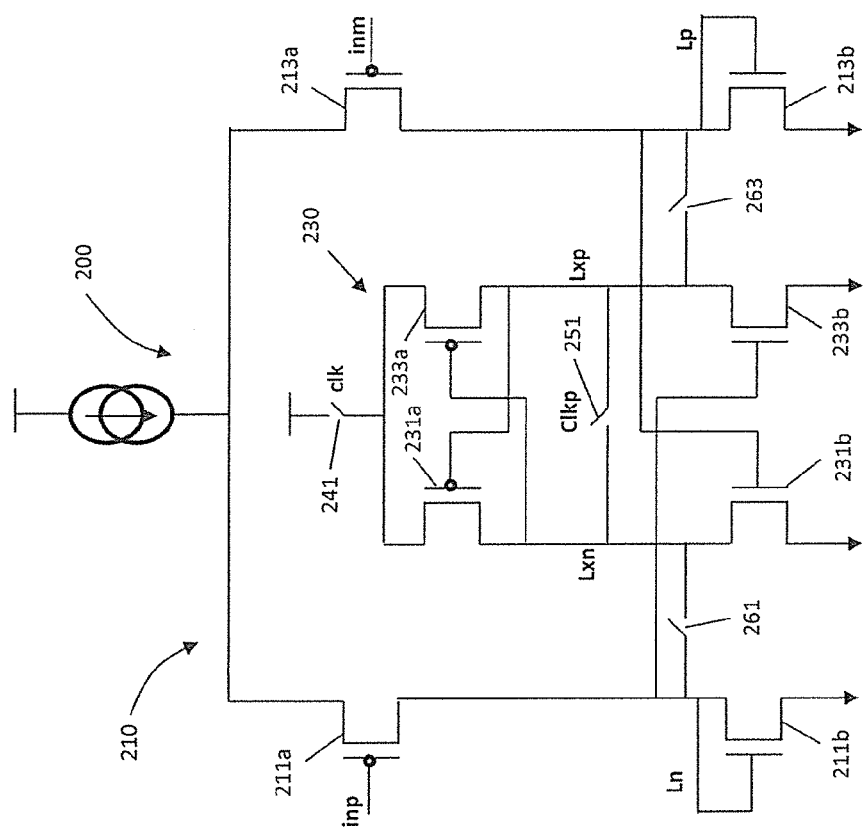
FIG. 2 illustrates a schematic diagram of a latching comparator in accordance with aspects of the invention.

FIG. 2 illustrates a schematic diagram of a latching comparator in accordance with aspects of the invention. The latching comparator 200 includes pre-amplifying circuitry 210 and latch circuitry 230. In some embodiments, the pre-amplifying circuit 210 may implement circuitry of the differential amplifier 121 of FIG. 1, and the latch circuitry 230 may implement circuitry of the latch 131 of FIG. 1.

As illustrated in FIG. 2, the pre-amplifying circuitry 210 and the latch circuitry 230 are formed using various pull-up and pull-down devices. The pull-up and pull down devices may be formed, for example, with metal-oxide-semiconductor field-effect transistor (MOSFET) transistors, with p-channel MOS transistors forming the pull-up devices and n-channel MOS transistors forming the pull-down devices.

The pre-amplifying circuitry 210 includes a first pull-up device 211a, a first pull-down device 211b, a second pull-up device 213a, and a second pull-down device 213b. The first pull-up and pull-down devices are connected in series. The second pull-up and pull-down devices are also connected in series. Sources of the first and second pull-up devices are connected to a high power source, and sources of the first and second pull-down devices are connected to a low power source. A gate of the first pull-down device is connected to an output node between drains of the first pull-up and pull-down devices. A gate of the second pull-down device is connected to an output node between drains of the second pull-up and pull-down devices.

The latch circuitry 230 includes a third pull-up device 231a and a third pull-down device 23 lb coupled in series, and a fourth pull-up device 233a and a fourth pull-down device 233b also coupled in series. Sources of the third and fourth pull-up devices are connected to a latching switch 241, and sources of the third and fourth pull-down devices are connected to the lower voltage source, as with the first and second pull-down devices. The third and fourth pull-up devices are arranged in a cross-coupled configuration, a gate of each device being connected to a drain of the other device. The third and fourth pull-down devices are also arranged in a cross-coupled configuration with the first and second pull-down devices. As such, a gate of the third pull-down device is connected to the output node between the drains of the second pull-up and pull-down devices, and a gate of the fourth pull-down device is connected to the output node between the drains of the first pull-up and pull-down devices.

Referring to FIG. 2, the comparator 200 may further include a first output switch 261, a second output switch 263, and a reset switch 251. The first output switch has one end connected to the output node between the drains of the first pull-up and pull-down devices and another end connected to a first latching node at a drain of the third pull-down device. Similarly, the second output switch has one end connected to the output node between the drains of the second pull-up and pull-down devices and another end connected to a second latching node at a drain of the fourth pull-down device. The reset switch has one end connected to first latching node and another end connected to the second latching node. In many embodiments, the reset switch is provided a clock pulse.

In operation, the pre-amplifying circuitry 210 receives differential input signals (inp, inm) at gates of the first and second pull-up devices. The pre-amplifying circuitry amplifies the differential input signals and provides intermediate differential signals at the output node between the drains of the first pull-up and pull-down devices and the output node between the drains of the second pull-up and pull-down devices. In particular, input signal inp is connected to the gate of the first pull-up device and a complimentary input signal inm is connected to the gate of the second pull-up device. The intermediate differential signals are formed from the drains of the first pull-up and pull-down devices and the drains of the second pull-up and pull-down devices.

The intermediate differential signals are provided to the gates of the third and fourth pull-down devices of the latch 230. As with the latch 131 of FIG. 1, the latch 230 holds or latches the intermediate differential signals when the latch 230 transitions from a track phase to a hold phase. In various embodiments, transitioning from the track phase to the hold phase occurs when the latching switch 241 transitions to a closed state from an open state. In many embodiments, the latching switch 241 is driven by a clock signal. The latch 230 then produces output signals (Lxn, Lxp) at the first and second latching nodes respectively.

Moreover, the reset switch 251 may be utilized to balance or settle the output signals (Lxn, Lxp) so that bias current is divided evenly between the first and second latching nodes. In some embodiments, this is accomplished by providing the reset switch a pulse. For example, when the reset switch is active or ON, a resistance is provided between the first and second latching nodes. This tends to bring the output signals (Lxn, Lxp) fast to settle. Similarly, the first output switch may be utilized to stabilize output signals at the output node between the first pull-up and pull-down devices and the first latching node, and the second output switch may also be utilized to stabilize output signals at the output node between the second pull-up and pull-down devices and the second latching node. In various embodiments, the reset switch 251 is driven by a reset signal with a duty cycle much smaller compared to that of the clock signal.

Figure 3:
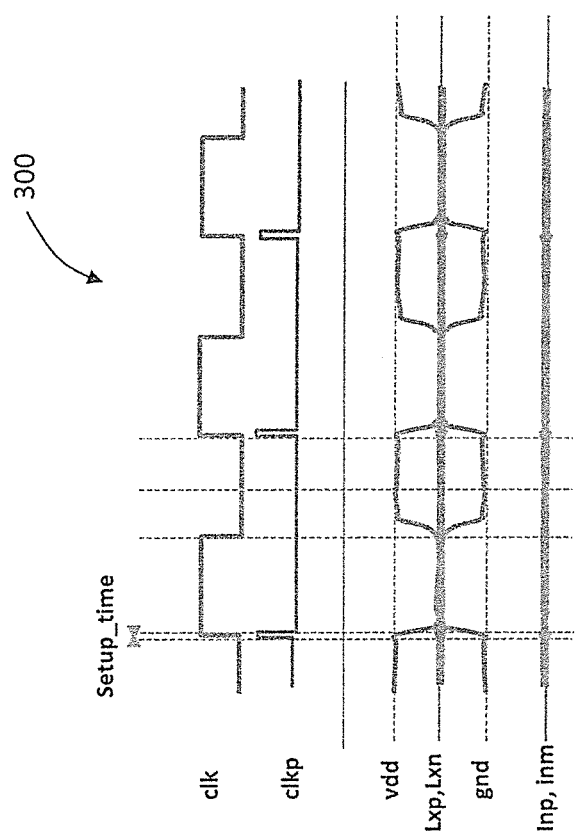
FIG. 3 illustrates a graph depicting signals in a latching comparator including transient response data in accordance with aspects of the invention.

FIG. 3 illustrates a graph depicting signals in a latching comparator including transient response data in accordance with aspects of the invention. In some embodiments, FIG. 3 may depict simulated results of the latching comparator 200 of FIG. 2.

In graph 300 shown in FIG. 3, six signals are depicted with respect to time, including a clock signal (clk), a reset pulse (clkp), a high voltage signal (vdd), output signals (Lxp, Lxn), a low voltage signal (gnd), and differential input signals (Inp, inm). In general, graph 300 shows the effect on the output signals (Lxp, Lxn) when the reset pulse (clkp) is active or high. In more detail, during setup in a latching comparator (e.g., latching comparator 200 of FIG. 2), differential output signals generated from a differential amplifier often pull back output signals at output latching nodes of a latch. Moreover, the differential output signals often suffer disturbance which leads to kickback of differential input signals of the differential amplifier. Accordingly, by having a reset signal providing pulses for driving a reset switch, such disturbance can be mitigated and the output signals at the output latching nodes are stabilized.

Referring to FIG. 3, at every rising edge of the clock signal (clk), the reset pulse (clkp) transitions from low to high providing a pulse with a duty cycle equivalent or approximate to a setup time. The pulse, for example, drives a reset switch (e.g., the reset switch 251 of FIG. 2) to short output signals at output latching nodes of a latch (e.g., the latch 230 of FIG. 2) for a period of time in accordance with the pulse provided by the reset signal (clkp). Accordingly, as shown in FIG. 3, the output signals (Lxp, Lxn) remain steady and generally maintain a flat line without any indication of disturbance during the setup time.

Figure 4:
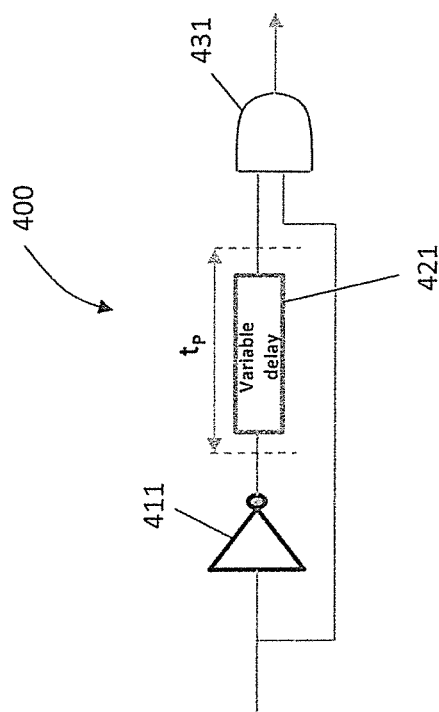
FIG. 4 is a semi-schematic, semi-block diagram of a circuitry for generating a reset signal for controlling a reset switch in accordance with aspects of the invention.

FIG. 4 is a semi-schematic, semi-block diagram of a circuitry for generating a reset signal for controlling a reset switch in accordance with aspects of the invention. The reset switch, for example, may be the reset switch 251 of FIG. 2. In some embodiments, the reset signal may be the reset signal (clkp) of FIG. 3.

As illustrated in FIG. 4, the circuitry 400 includes an inverter 411, a variable delay block 421, and an AND gate 431. The inverter 411 generally receives an input signal, for example from a local clock, and outputs an inverted or negated signal. The variable delay block 421 receives the inverted signal from the inverter, and holds or delays the inverted signal for a reset time period tp. The variable delay block 421 then forwards the inverted signal to the AND gate 431. The AND gate receives the inverted signal along with the input signal and generates a reset signal based on states of the input and inverted signals. Such arrangement would allow the circuitry 400 to generate a reset signal with a duty cycle equal or approximate to the reset time period tp.

Figure 5:
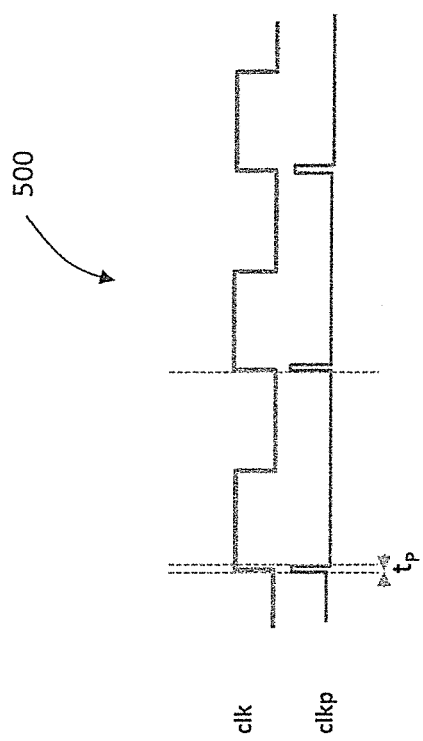
FIG. 5 is a graph depicting signals in a circuitry for generating a reset pulse in accordance with aspects of the invention.

FIG. 5 is a graph depicting signals in a circuitry for generating a reset pulse in accordance with aspects of the invention. In some embodiments, FIG. 5 may depict simulated results of the circuitry 400 of FIG. 4.

In graph 500 shown in FIG. 5, two types of data are depicted including a clock signal (clk) and a reset pulse (clkp). As illustrated in FIG. 5, the reset signal (clkp) transitions from low ("0") to high ("1") at every rising edge of the clock signal (clk). The reset pulse (clkp) remains high for a period of time tp and subsequently, transitions from high to low. In various embodiments, the period of time tp is equivalent or approximate to the reset time period tp shown in FIG. 4.

Although the invention has been discussed with respect to various embodiments, it should be recognized that the invention comprises the novel and non-obvious claims supported by this disclosure.

What is claimed is:

1. A high-speed comparator, comprising:
   a differential amplifier configured to receive differential input signals and generate a differential pair of intermediate signals;
   a latch configured to generate a pair of output signals at a respective pair of latching nodes based on the differential pair of intermediate signals;
   a reset switch configured to control the pair of output signals based on a reset pulse so as to settle the pair of output signals, the reset switch configured to couple the pair of latching nodes; and
   a pulse generator to generate the reset pulse;
   wherein the differential amplifier comprises a first pull-up device and a first pull-down device connected in series, with a gate of the first pull-down device connected to a node between the first pull-up device and the first pull-down device, and a second pull-up device and a second pull-down device connected in series, with a gate of the second pull-down device connected to a node between the second pull-up device and the second pull-down device;
   wherein the latch comprises a third pull-up device and a third pull-down device connected in series, and a fourth pull-up device and a fourth pull-down device connected in series, with gates and drains of the third and fourth pull-up devices cross-connected at the pair of latching nodes, and with gates of the third and fourth pull-down devices cross-connected with drains of the first and second pull-down devices at the node between the first pull-up device and the first pull-down device and the node between the second pull-up device and the second pull-down device;
   wherein sources of the third and fourth pull-up devices are coupled to a power supply based on a clock signal; and
   wherein the reset pulse has a duty cycle much smaller than the clock signal.

2. A method for operating a high-speed comparator having a differential amplifier and a latch comprising:
   receiving a differential pair of input signals by the differential amplifier;
   generating a differential pair of intermediate signals by the differential amplifier using the differential pair of input signals;
   receiving, by the latch, the differential pair of intermediate signals, the latch driven by a clock signal;
   providing, by the latch, a pair of output signals at a respective pair of latching nodes based on the differential pair of intermediate signals; and
   activating a reset switch based on a reset pulse having a duty cycle, the reset switch coupling the pair of latching nodes, the duty cycle of the reset pulse being smaller than a duty cycle of the clock signal.

3. The method of claim 2, further comprising:
   generating the reset pulse for use in activating the reset switch based on an input signal and an intermediate signal provided by a variable delay block; and
   stabilizing, by the reset switch, the pair of output signals when the reset switch is active.

4. The method of claim 2, wherein the duty cycle of the reset pulse corresponds to a setup time for the latch.

5. The method of claim 2, wherein the receiving the differential pair of input signals occurs at gates of p-channel transistors of the differential amplifier.

6. The method of claim 2, wherein the receiving, by the latch, the differential pair of intermediate signals occurs at gates of n-channel transistors of the latch.

7. The method of claim 2, further comprising activating a first output switch and activating a second output switch so as to stabilize the differential pair of intermediate signals.

* * * * *